United States Patent
Lau

(10) Patent No.: US 10,206,307 B2
(45) Date of Patent: Feb. 12, 2019

(54) IMMERSION COOLING

(71) Applicant: Bitfury Group Limited, George Town, Grand Cayman (KY)

(72) Inventor: Kar-Wing Lau, Tsing Yi (CN)

(73) Assignee: BitFury Group Limited, George Town, Grand Cayman (KY)

( * ) Notice: Subject to any disclaimer, the term of this patent is extended or adjusted under 35 U.S.C. 154(b) by 0 days.

(21) Appl. No.: 15/584,670

(22) Filed: May 2, 2017

(65) Prior Publication Data
US 2017/0325355 A1  Nov. 9, 2017

(30) Foreign Application Priority Data
May 3, 2016 (GB) .................................. 1607662.2

(51) Int. Cl.
*H05K 7/20* (2006.01)
(52) U.S. Cl.
CPC .......... *H05K 7/203* (2013.01); *H05K 7/2029* (2013.01); *H05K 7/20318* (2013.01); *H05K 7/20381* (2013.01)
(58) Field of Classification Search
None
See application file for complete search history.

(56) References Cited

U.S. PATENT DOCUMENTS

| 3,406,244 | A |  | 10/1968 | Oktay |
|---|---|---|---|---|
| 3,774,677 | A |  | 11/1973 | Antonetti et al. |
| 4,501,123 | A |  | 2/1985 | Ina |
| 4,590,538 | A |  | 5/1986 | Cray, Jr. |
| 5,131,233 | A | * | 7/1992 | Cray ......................... G06F 1/20 165/104.33 |
| 5,305,184 | A |  | 4/1994 | Andresen et al. |
| 5,463,872 | A |  | 11/1995 | Vader et al. |
| 5,688,398 | A |  | 11/1997 | Jacquelin et al. |
| 6,019,167 | A |  | 2/2000 | Bishop et al. |
| 2003/0235036 | A1 |  | 12/2003 | Ostby |

(Continued)

FOREIGN PATENT DOCUMENTS

| CN | 102842406 A | 12/2012 |
|---|---|---|
| CN | 104166448 A | 11/2014 |

(Continued)

OTHER PUBLICATIONS

Simons et al., "A Survey of Vapor Phase Cooling Systems," Electrical Design News 14(1):53-56 (1969).

(Continued)

*Primary Examiner* — Robert J Popovics
(74) *Attorney, Agent, or Firm* — Goodwin Procter LLP

(57) ABSTRACT

A method of apparatus for immersion cooling electronic equipment including immersing the electronic equipment in a pressure-sealed tank containing a heat transfer fluid and including a vapor space fluidicly coupled to a condenser; operating the electronic equipment to generate heat and evaporate some of the heat transfer fluid, causing heat transfer fluid vapor to enter the condenser; condensing the heat transfer fluid vapor in the condenser to produce a condensate; returning the condensate to the tank; and increasing power consumption to increase heat generated by the electronic equipment and develop an increased pressure of the heat transfer fluid vapor to bring the apparatus into an equilibrium condition.

12 Claims, 4 Drawing Sheets

(56) References Cited

U.S. PATENT DOCUMENTS

| | | |
|---|---|---|
| 2004/0007992 A1 | 1/2004 | Ribarich |
| 2007/0034360 A1 | 2/2007 | Hall |
| 2008/0115528 A1 | 5/2008 | Yamamoto et al. |
| 2010/0101759 A1 | 4/2010 | Campbell et al. |
| 2010/0101765 A1 | 4/2010 | Campbell et al. |
| 2010/0103614 A1 | 4/2010 | Campbell et al. |
| 2010/0103618 A1 | 4/2010 | Campbell et al. |
| 2010/0103620 A1 | 4/2010 | Campbell et al. |
| 2010/0118494 A1 | 5/2010 | Campbell et al. |
| 2010/0328889 A1 | 12/2010 | Campbell et al. |
| 2010/0328890 A1 | 12/2010 | Campbell et al. |
| 2010/0328891 A1 | 12/2010 | Campbell et al. |
| 2011/0267768 A1 | 11/2011 | Attlesey |
| 2011/0286177 A1 | 11/2011 | Attlesey |
| 2011/0315343 A1 | 12/2011 | Campbell et al. |
| 2011/0315344 A1 | 12/2011 | Campbell et al. |
| 2011/0315353 A1 | 12/2011 | Campbell et al. |
| 2011/0315355 A1 | 12/2011 | Campbell et al. |
| 2011/0317367 A1 | 12/2011 | Campbell et al. |
| 2013/0019614 A1 | 1/2013 | Campbell et al. |
| 2013/0021746 A1 | 1/2013 | Campbell et al. |
| 2013/0021752 A1 | 1/2013 | Campbell et al. |
| 2013/0091866 A1 | 4/2013 | Campbell et al. |
| 2013/0105120 A1 | 5/2013 | Campbell et al. |
| 2013/0105122 A1 | 5/2013 | Campbell et al. |
| 2014/0068942 A1 | 3/2014 | Campbell et al. |
| 2014/0071625 A1 | 3/2014 | Luo et al. |
| 2014/0071627 A1 | 3/2014 | Campbell et al. |
| 2014/0082942 A1 | 3/2014 | Campbell et al. |
| 2014/0085817 A1 | 3/2014 | Campbell et al. |
| 2014/0123492 A1 | 5/2014 | Campbell et al. |
| 2014/0123493 A1 | 5/2014 | Campbell et al. |
| 2014/0133096 A1 | 5/2014 | Campbell et al. |
| 2014/0146467 A1 | 5/2014 | Campbell et al. |
| 2014/0216686 A1 | 8/2014 | Shelnutt et al. |
| 2014/0216711 A1 | 8/2014 | Shelnutt et al. |
| 2014/0318167 A1 | 10/2014 | Uchida |
| 2014/0355212 A1 | 12/2014 | Campbell et al. |
| 2015/0022975 A1 | 1/2015 | Browne et al. |
| 2015/0060009 A1 | 3/2015 | Shelnutt et al. |
| 2015/0062806 A1 | 3/2015 | Shelnutt et al. |
| 2015/0070846 A1 | 3/2015 | Shelnutt et al. |
| 2015/0109728 A1 | 4/2015 | Campbell et al. |
| 2015/0109729 A1 | 4/2015 | Campbell et al. |
| 2015/0109730 A1 | 4/2015 | Campbell et al. |
| 2015/0109735 A1 | 4/2015 | Campbell et al. |
| 2015/0319887 A1 | 11/2015 | Flory et al. |
| 2015/0319889 A1 | 11/2015 | Flory et al. |
| 2017/0325355 A1* | 11/2017 | Lau .................. H05K 7/2029 |
| 2017/0326489 A1* | 11/2017 | Lau .................. B01D 46/0005 |

FOREIGN PATENT DOCUMENTS

| | | |
|---|---|---|
| FR | 1064730 A | 5/1954 |
| FR | 2413624 A1 | 7/1979 |
| FR | 3015645 A1 | 6/2015 |
| GB | 1595094 A | 8/1981 |
| GB | 2389174 A | 12/2003 |
| GB | 2432460 A | 5/2007 |
| JP | 4256346 A2 | 4/2009 |
| WO | WO-2013075620 A1 | 5/2013 |

OTHER PUBLICATIONS

International Search Report and Written Opinion for International Patent Application No. PCT/IB2017/000711, dated Aug. 30, 2017 (15 pages).

Ramaswamy et al. "Combined Effects of Sub-Cooling and Operating Pressure on the Performance of a Two-Chamber Thermosyphon," IEEE Transactions on Component and Packaging Technology, vol. 23(1) (Mar. 2000).

* cited by examiner

IMMERSION COOLING

CROSS-REFERENCE TO RELATED APPLICATIONS

This application claims the benefit of U.K. Application No. GB1607662.2 filed May 3, 2016, which is hereby incorporated herein by reference in its entirety.

TECHNICAL FIELD

The present disclosure relates to immersion cooling and more particularly to immersion cooling of electronic equipment.

BACKGROUND

Immersion cooling is a technology used to cool electronic processing equipment, particularly for high speed and high data capacity processing equipment, where conventional air cooling has been found inadequate. Immersion cooling involves immersing the equipment (e.g. electronic data processing modules) in a tank containing a liquid. Convection and evaporation of the liquid can provide very high cooling rates to keep the modules within their normal operating temperature range. Water is not an ideal liquid to use for these applications because (a) it is electrically conductive meaning that some type of insulation would need to be used between the water and the electronics, thereby reducing the cooling effectiveness, and (b) because water evaporates at too high a temperature. Instead more effective, non-conductive cooling fluids that evaporate at lower temperatures have been developed. An example of this is the NOVEC™ 649 engineered fluid manufactured by 3M™ of St. Paul, Minn. However, even with the use of these fluids problems can arise if moisture gets into the liquid. Even small amounts of water can cause shorting of electrical connections in the electronic equipment. Another problem is that because the specialized cooling liquids are expensive, it is important to retain all, or as much as possible of the material in the vessel and to minimize any loss as a result of the evaporation.

Various modifications and improvements in immersion cooling are presented below.

SUMMARY

In one aspect the present invention provides a method of immersion cooling of electronic equipment. The electronic equipment is immersed in a pressure-sealed tank holding heat transfer fluid in liquid form. The tank includes a vapor space above a surface of the liquid, and the vapor space is connected to a condenser. The electronic equipment is operated to generate heat so as to evaporate some of the heat transfer fluid and cause heat transfer fluid vapor to enter the condenser. The heat transfer fluid vapor is condensed in the condenser, such that gaseous heat transfer fluid returns to its liquid state. The heat transfer fluid condensate is returned to the tank. The power consumption by the electronic equipment is increased to increase the heat generated and develop an increased pressure of the heat transfer fluid vapor as the gaseous form of the heat transfer fluid uses more volume that its liquid form. The increased pressure increases effectiveness of the condenser and changing back voluminous heat transfer gas to its more compact liquid phase brings the system into an equilibrium condition.

The method may further comprise reducing power consumption by the electronic equipment to reduce the heat generated and cause the pressure of the heat transfer fluid vapor to drop, the lower pressure decreasing the boiling point of the heat transfer fluid to bring the system back to equilibrium. The reduced power consumption may cause a degree of vacuum to be developed inside of the tank. The power consumption by the electronic equipment may be reduced substantially to zero, so that the pressure of the heat transfer fluid vapor in the tank is reduced to about 0.4 bar (absolute).

The method may further comprise filtering the condensate to remove any moisture and/or metal particles before returning the condensate to the tank.

The heat transfer fluid is preferably a dielectric fluid.

In some embodiments the method may include features more commonly associated with other methods that involve a non-pressurized tank. For example, the method may further comprise condensing some of the heat transfer fluid vapor by means of condenser tubes in the tank.

As another example, the method may further comprise removing moisture from air in the vapor space of the tank by means of a desiccant.

In another aspect the present invention provides an apparatus for immersion cooling of electronic equipment. A pressure-sealed tank holds heat transfer fluid in liquid form into which the electronic equipment can be immersed. The pressure-sealed tank includes a vapor space above a surface of the liquid. A condenser having an inlet connected to the vapor space receives heat transfer fluid vapor, and has a sealable vapor outlet and a condensate outlet. Condensed heat transfer fluid can return from the condensate outlet to the tank through a condensate return line.

The apparatus may further comprise a filter in the condensate return line for removing moisture and/or metallic particles.

In some embodiments the apparatus may include features more commonly associated with a non-pressurized tank system. For example, the apparatus may further comprise means inside the tank for condensing heat transfer fluid vapor. The means for condensing may comprise a bank of condenser tubes.

As another example, the apparatus may further comprise a desiccant for aiding removal of moisture from air in the vapor space of the tank.

In another aspect the invention provides a method of commencing immersion cooling of electronic equipment. The electronic equipment is immersed in a pressure-sealed tank holding heat transfer fluid in liquid form. The tank includes a vapor space above a surface of the liquid. The vapor space is connected to a condenser, which is disposed above the tank and includes a vapor outlet with a valve operable for sealing the vapor outlet. Operation of the electronic equipment is commenced to generate heat so as to evaporate some of the heat transfer fluid and produce heat transfer fluid vapor in the vapor space. The valve is opened to allow the heat transfer fluid vapor generated to drive air from the vapor space through the condenser and out through the vapor outlet until substantially all of the air has been driven out of the vapor space. The valve is then closed and operation of the electronic equipment continued to generate heat so as to produce heat transfer fluid vapor. The heat transfer fluid vapor is condensed in the condenser to produce heat transfer fluid condensate, which is returned to the tank.

DETAILED DESCRIPTION

Figure 1:
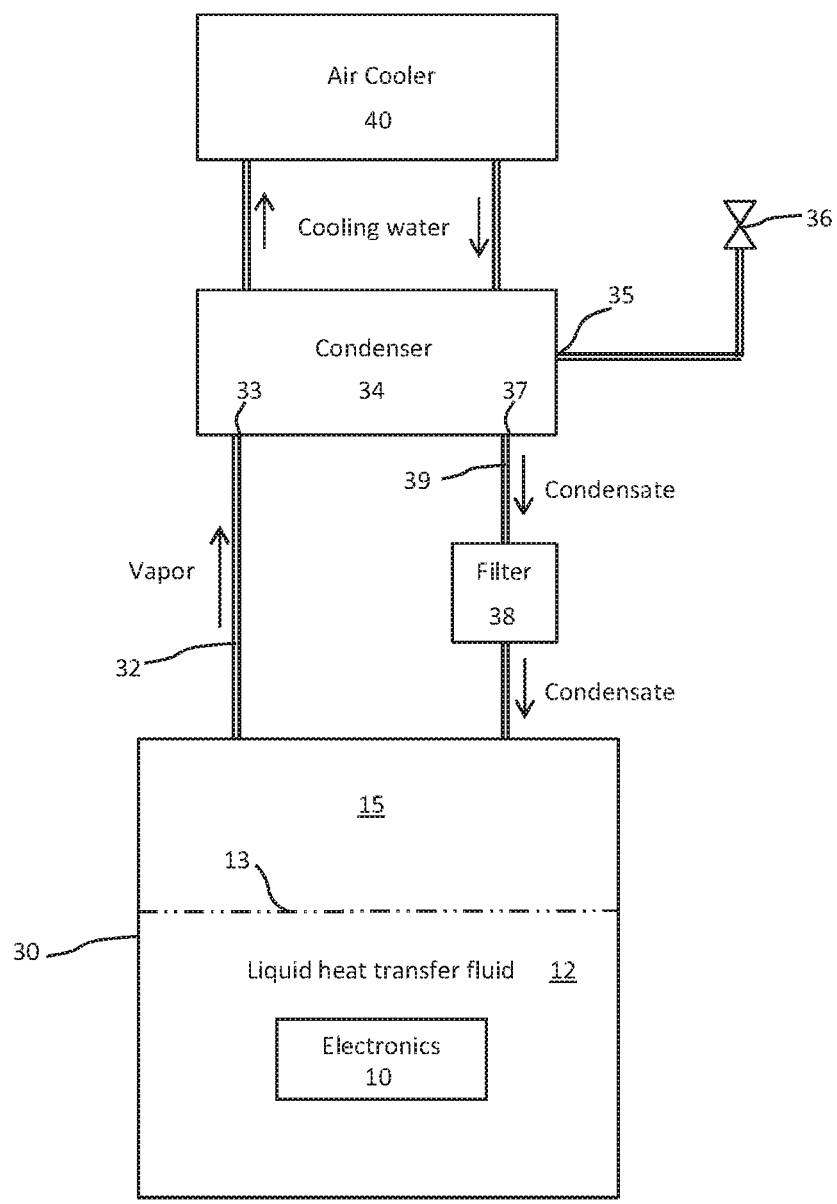
FIG. 1 is a schematic illustration of an immersion cooling system in accordance with embodiments of the invention.

FIG. 1 is a schematic illustration of an embodiment of an immersion cooling system. In this system a condenser is mounted as a separate component outside the evaporation tank. The tank is sealed from the surrounding atmosphere and permitted to operate at a variable pressure. After the initial start-up procedure is completed there is no air in the tank atmosphere, only vapor of the heat transfer fluid.

As shown in FIG. 1, the electronic components 10 are immersed in the heat transfer fluid 12 in liquid form in a pressure-sealed tank 30. The liquid heat transfer fluid 12 has a surface 13 in the tank 30, above which is a vapor space 15. The liquid heat transfer fluid 12 removes heat from the components by convection and evaporation within the tank 30. The vapor of the heat transfer fluid 12 is heavier than air.

A riser tube 32 extends from an opening 31 in the roof of the tank 30 to an inlet 33 of a condenser 34. The condenser 34 includes internal tubes (not shown) through which a coolant (e.g. water) is circulated. The vapor passes through the condenser in passages between the tubes towards a vapor outlet 35. A valve 36 can be opened to allow air or vapor to pass from the vapor outlet 35 to the atmosphere, and can be closed to seal the vapor outlet 35. The condenser also has a condensate outlet 37 into a return line 39, through which condensate can flow back to the tank 30 and which includes an in-line filter 38. The coolant that is circulated through the condenser 34 is returned to an air cooler 40 for removal of heat that is taken from the vapor in the condenser.

To ensure that the heat transfer liquid and vapor within the tank is completely dry the air in the vapor space 15 is removed at start up. During the start-up procedure when power is provided to the electronic equipment 10 and the heat transfer liquid 12 starts to evaporate the pressure in the tank 30 starts to rise. At this moment the valve 36 is opened. Because the heat transfer fluid vapor is heavier then air, most of the air is located in the condenser 34 or in the top part of the vapor space 15. When the valve 36 is opened and some amount of pressure is built up within the tank 30, air quickly leaves the system through the valve 36. Air and any vapor leaving through valve 36 may be directed to a purger system (not shown), which condenses the heat transfer fluid vapor to liquid form and releases only air. This way it is possible to save some additional heat transfer fluid during the start-up sequence. After that the valve 36 is closed and the tank 30 is ready for long term cooling operation.

The heat transfer fluid vapor rises through the riser tube 32 into the condenser 34, where it condenses to form a liquid condensate. The condensate returns to the tank 30 through the return line 39 and filter 38. The filter 38 is provided to remove any moisture remaining in the condensate and may also remove metallic (e.g. copper) particles that may have been picked up by the liquid from the condenser tubes.

There is an equilibrium point in the tank. For a certain power consumption by the electronic equipment 10 (say 250 kW), a certain water flow through the condenser 34 (say 500 liters per minute) and a certain input water temperature (say 48 C) then the pressure in the tank 30 is about normal (e.g. atmospheric). The pressure in the tank 30 will change with changing power consumption by the electronic equipment 10. If power consumption stops, then pressure in the tank will typically drop to about 0.4 bar (absolute). If power is consumed, but at a lower rate than normal, then some degree of vacuum is developed inside the tank 30. Lower pressure decreases the boiling point of the heat transfer liquid bringing the system back to a stable equilibrium. If there is higher than normal power consumption, then the tank 30 develops a somewhat increased pressure. Because of this increased pressure the condenser 34 becomes more effective bringing the system back to a stable equilibrium again.

Figure 2:
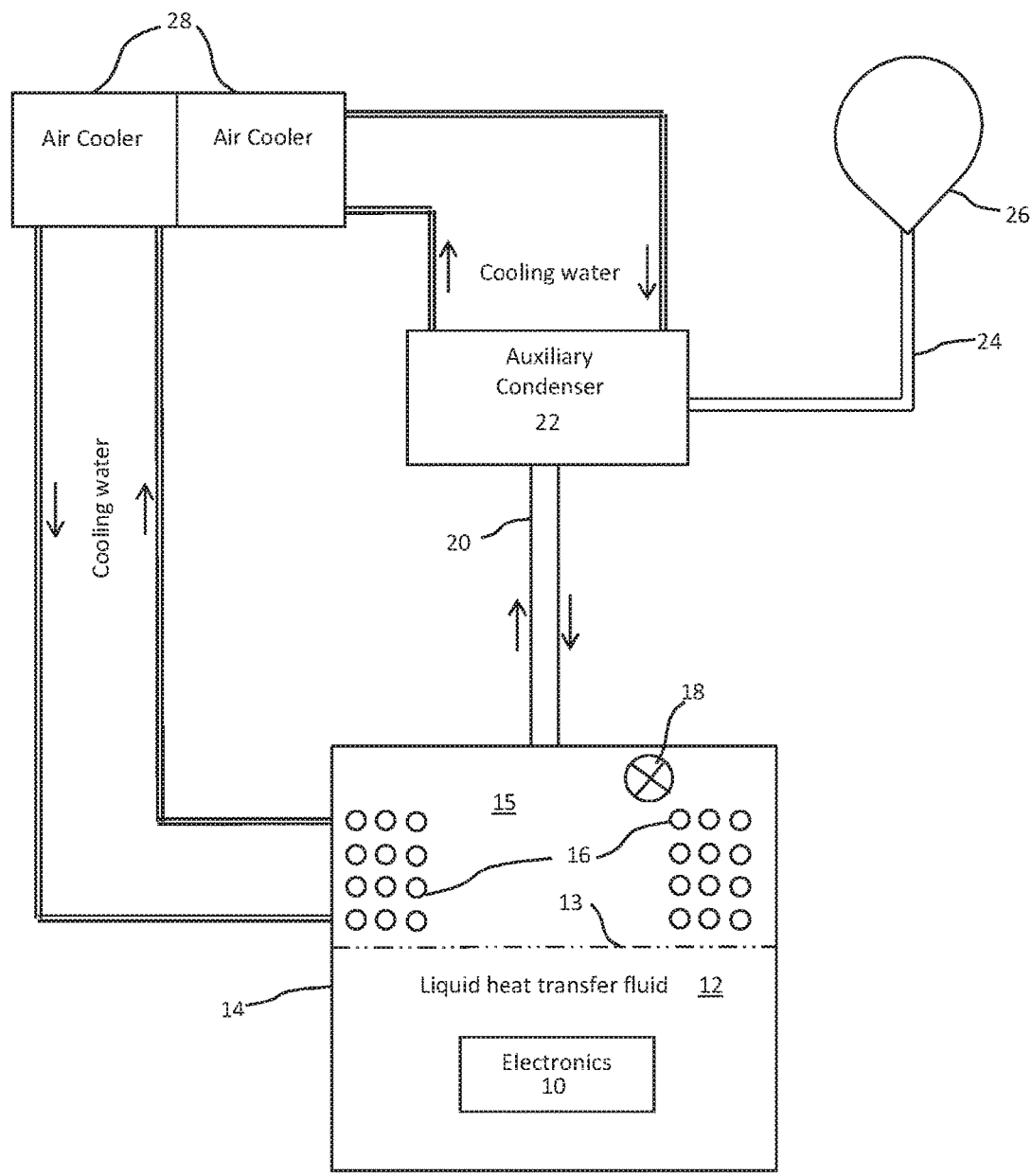
FIG. 2 is a schematic illustration of another immersion cooling system.

FIG. 2 illustrates schematically another immersion cooling system. Equivalent features are designated with the same reference numerals as used in FIG. 1. In the system of FIG. 2 a tank 14, which contains the heat transfer fluid 12, is designed to operate at a substantially constant pressure (e.g. atmospheric pressure). As with the system of FIG. 1, the electronic equipment 10 is immersed in the heat transfer fluid liquid 12, which removes heat from the electronic equipment 10 by convection and evaporation within the tank 14.

Banks of water-cooled tubes 16 act as condensers to condense the evaporated liquid inside the tank 14. To ensure that the heat transfer fluid liquid 12 and the atmosphere within the tank 14 is completely dry, the atmosphere (evaporated fluid in air) inside the tank 14 is circulated through a desiccant 18 (e.g. silica gel). A small fan (not shown) may be used to aid the circulation through the desiccant 18.

An auxiliary condenser 22 is disposed above the tank 14 and connected to an opening in the roof of the tank 14 by a riser tube 20. The auxiliary condenser 22 also has an outlet tube 24 that is connected to an expansion chamber or volume, which in the system depicted in FIG. 1 is a balloon 26. Other forms of expansion chamber, such as a bellows could also be used.

Both the main condenser tubes 16 in the tank 14 and the auxiliary condenser 22 are supplied with cooling water, which is circulated through air-coolers 28 to remove the heat picked up from the condensing heat transfer fluid.

The atmosphere inside the tank 14 is maintained at a substantially constant pressure, which may typically be atmospheric pressure. This helps to ensure that the heat transfer fluid liquid 12 continues to evaporate to draw heat away from the electronic components 10 at a constant, optimal rate. In order to maintain the pressure at a substantially constant level any small increase in volume of the atmosphere in the tank 14 (e.g. due to a rise in temperature) results in an upward flow of air/vapor in the riser tube 20 and into the auxiliary condenser 22. Vapor from the heat transfer fluid is condensed in the auxiliary condenser 22 and runs back under gravity down the riser tube 20 and into the tank 14. The balloon 26 maintains a seal against the external atmosphere (to ensure that moisture cannot enter the system). The air/vapor in the riser tube 20, after passing through the condenser 22, passes into the outlet tube 24 causing the balloon 26 to expand. A reduction in the volume of the tank 14 atmosphere will have the opposite effect, causing the balloon 26 to contract.

Although the two systems of FIGS. 1 and 2 operate under different pressure control regimes, it will be appreciated that there many features of the system of FIG. 2 that could be employed in the system of FIG. 1. For example, the tank 30 in the system of FIG. 1 could include additional banks of condenser tubes similar to the main condenser tubes 16 of FIG. 2. Also a desiccant could be used to aid removal of moisture from air in the vapor space 15 of the tank of FIG. 1.

Similarly there may be features of the system of FIG. 1 that could be employed in the system of FIG. 2. For example, a separate condensate return pipe could be employed from the auxiliary condenser 22 to include a filter for filtering the condensate. Also, the system of FIG. 2 could employ a method of removing air from the tank 14 at start up similar to the method described for the FIG. 1 system. In that case a valve could be provided that could be opened to allow the outlet tube 24 to vent to atmosphere during the start-up procedure.

Figure 3:
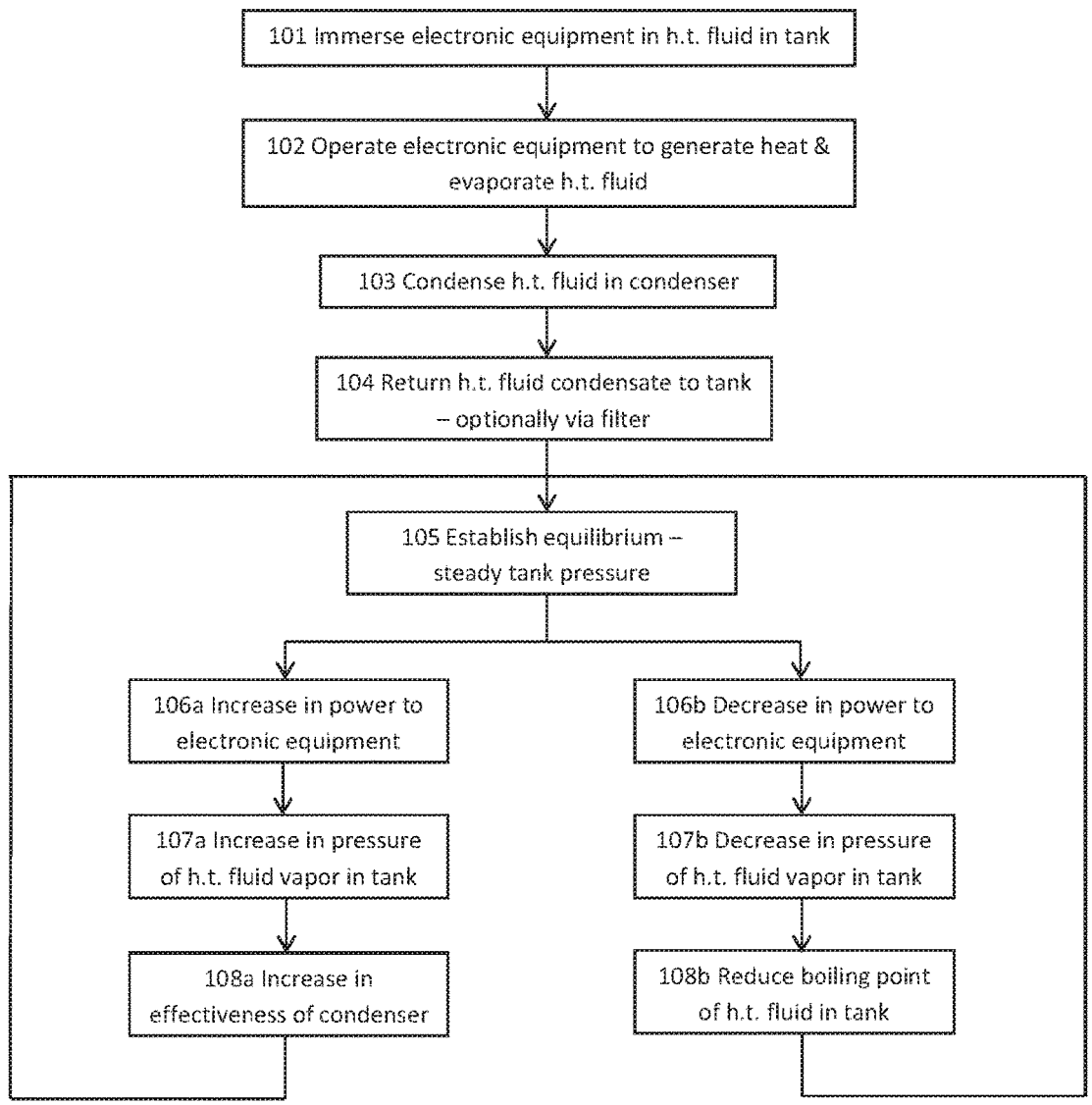
FIG. 3 is a flow chart illustrating the principal method steps in an immersion cooling method in accordance with embodiments of the invention.

Referring to FIG. 3, a method of immersion cooling of electronic equipment begins at step 101 by immersing the electronic equipment in a tank, such as the pressure-sealed tank 30 of FIG. 1, holding heat transfer fluid (h.t. fluid) in liquid form. At step 102 the electronic equipment is operated to generate heat and evaporate some of the heat transfer fluid so as to cause heat transfer fluid vapor to enter the condenser. At step 103 the heat transfer fluid vapor is condensed in a condenser such as the condenser 34 of FIG. 1, to produce heat transfer fluid condensate. At step 104, the heat transfer fluid condensate is returned to the tank. The system adopts an equilibrium condition in which the tank operates at a steady pressure (e.g. atmospheric pressure).

After step 104 further operation of the electronic equipment may incur either an increase or a decrease in power to the electronic equipment. Increasing power consumption by the electronic equipment, as indicated at step 106a leads to an increase in the heat generated and, at step 107a develops an increased pressure of the heat transfer fluid vapor. The increased pressure results, at step 108a, in an increase of the effectiveness of the condenser to bring the system back into an equilibrium condition (step 105).

Decreasing power consumption by the electronic equipment, as indicated at step 106b leads to a decrease in the heat generated and, at step 107b, has the opposite effect, causing a decrease in pressure of the heat transfer fluid vapor.

Figure 4:
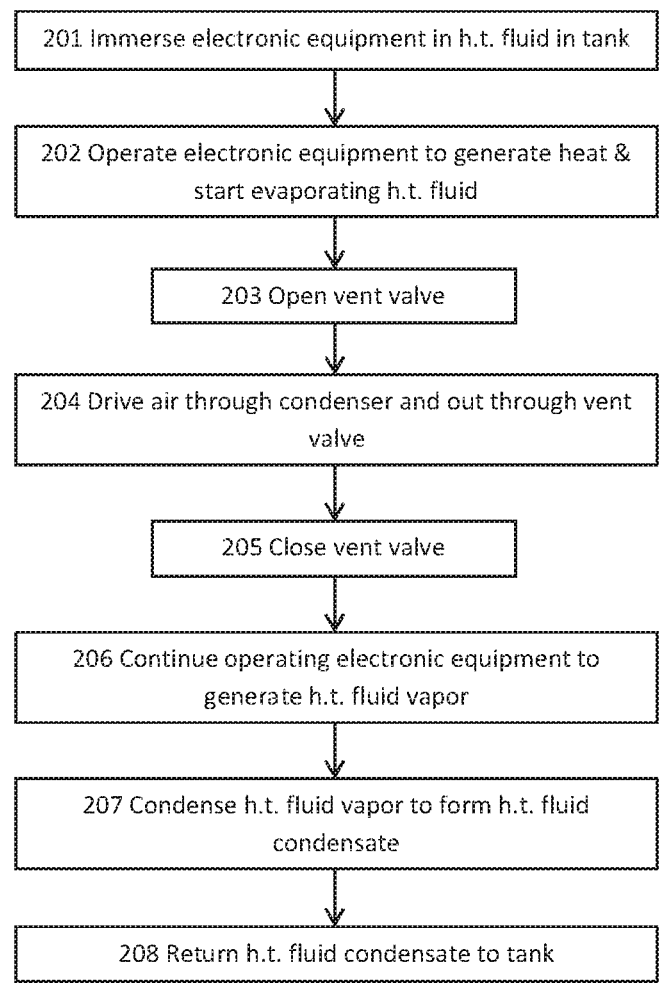
FIG. 4 is a flow chart illustrating the principal method steps in a method of commencing immersion cooling in accordance with embodiments of the invention.

Referring to FIG. 4, a method of commencing immersion cooling of electronic equipment commences at step 201 by immersing the electronic equipment in a tank, such as the pressure-sealed tank 30 of FIG. 1, holding heat transfer fluid (h.t. fluid) in liquid form. At step 202 operation of the electronic equipment is commenced to start generating heat so as to evaporate some of the heat transfer fluid and produce heat transfer fluid vapor. At step 203, a vent valve (e.g. vent valve 36 of FIG. 1) is opened so that, at step 204, the heat transfer fluid vapor generated drives air through the condenser and out through the vent valve until substantially all of the air has been driven out. At step 205 the vent valve is closed. At step 206, operation of the electronic equipment is continued, generating heat and producing heat transfer fluid vapor. At step 207, the heat transfer fluid vapor is condensed in the condenser to produce heat transfer fluid condensate, which is returned to the tank at step 208.

Having described certain embodiments of the invention, it will be apparent to those of ordinary skill in the art that other embodiments incorporating the concepts disclosed herein may be used without departing from the spirit and scope of the invention. The features and functions of the various embodiments may be arranged in various combinations and permutations, and all are considered to be within the scope of the disclosed invention. Accordingly, the described embodiments are to be considered in all respects as illustrative and not restrictive. The configurations, materials, and dimensions described herein are also intended as illustrative and in no way limiting. Similarly, although physical explanations have been provided for explanatory purposes, there is no intent to be bound by any particular theory or mechanism, or to limit the claims in accordance therewith.

What is claimed is:

1. A method of immersion cooling a system comprising electronic equipment, the method comprising:

immersing the electronic equipment in a pressure-sealed tank holding heat transfer fluid in liquid form, and including a vapor space in a condenser above a surface of the liquid heat transfer fluid, the vapor space including condenser tubes disposed between the surface of the liquid heat transfer fluid and spaced from an upper portion of the condenser;

operating the electronic equipment to generate heat so as to evaporate some of the heat transfer fluid and cause heat transfer fluid vapor to contact an exterior surface of the condenser tubes;

condensing the heat transfer fluid vapor on the exterior surface of condenser tubes to produce heat transfer fluid condensate;

returning the heat transfer fluid condensate to the heat transfer fluid in the tank; and controlling at least one of operation of and power consumption by the electronic equipment to operate the immersion cooling system at a substantially constant pressure, wherein increasing at least one of operation of and power consumption by the electronic equipment increases heat generated thereby increasing pressure of the heat transfer fluid vapor and decreasing at least one of operation of and power consumption by the electronic equipment decreases heat generated thereby decreasing pressure of the heat transfer fluid vapor, wherein the increased pressure increases an effectiveness of the condenser to bring the system into the equilibrium condition.

2. The method of claim 1, further comprising reducing power consumption by the electronic equipment to reduce the heat generated and cause a decrease in pressure of the heat transfer fluid vapor, the lower pressure decreasing a boiling point of the heat transfer fluid to bring the system back to equilibrium.

3. The method of claim 2, wherein the reduced power consumption causes a degree of vacuum to be developed inside of the tank.

4. The method of claim 3, wherein power consumption by the electronic equipment is reduced substantially to zero, and the pressure of the heat transfer fluid vapor in the tank is reduced to about 0.4 bar (absolute).

5. The method of claim 1 further comprising filtering the condensate to remove at least one of moisture and metal particles before returning the condensate to the heat transfer fluid in the tank.

6. The method of claim 1, wherein the heat transfer fluid comprises a dielectric fluid.

7. The method of claim 1 further comprising removing, by a desiccant, moisture from air in the vapor space.

8. The method of claim 1, wherein the equilibrium condition comprises a condition having steady pressure.

9. The method of claim 1, wherein the equilibrium condition comprises atmospheric pressure.

10. A method of commencing immersion cooling of electronic equipment, comprising:

immersing the electronic equipment in a pressure-sealed tank holding heat transfer fluid in liquid form, and including a vapor space in a first condenser above a surface of the liquid heat transfer fluid, the vapor space including condenser tubes disposed between the surface of the liquid heat transfer fluid and spaced from an upper portion of the tank, wherein the vapor space is connected to a second condenser disposed above the tank and including a vapor outlet with a valve operable for sealing the vapor outlet;

commencing operation of the electronic equipment to generate heat, so as to evaporate some of the heat transfer fluid, to produce heat transfer fluid vapor in the vapor space;

opening the valve to allow the heat transfer fluid vapor generated to drive air from the vapor space through the second condenser and out through the vapor outlet until substantially all of the air has been driven out of the vapor space;

closing the valve;

continuing operation of the electronic equipment to generate heat so as to produce heat transfer fluid vapor;

condensing the heat transfer fluid vapor on an exterior surface of the condenser tubes to produce heat transfer fluid condensate;

returning the heat transfer fluid condensate to the heat transfer fluid in the tank; and controlling at least one of operation of and power consumption by the electronic equipment to operate the immersion cooling system at a substantially constant pressure, wherein
increasing at least one of operation of and power consumption by the electronic equipment increases heat generated thereby increasing pressure of the heat transfer fluid vapor and
decreasing at least one of operation of and power consumption by the electronic equipment decreases heat generated thereby decreasing pressure of the heat transfer fluid vapor, wherein the increased pressure increases an effectiveness of the condenser to bring the system into the equilibrium condition.

11. The method of claim 10, wherein the equilibrium condition comprises a condition having steady pressure.

12. The method of claim 10, wherein the equilibrium condition comprises atmospheric pressure.

* * * * *